United States Patent
Chen

(10) Patent No.: US 11,961,578 B2
(45) Date of Patent: Apr. 16, 2024

(54) TEST DEVICE AND TEST METHOD THEREOF

(71) Applicant: NANYA TECHNOLOGY CORPORATION, New Taipei (TW)

(72) Inventor: Jyun-Da Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/900,876

(22) Filed: Sep. 1, 2022

(65) Prior Publication Data

US 2024/0079082 A1 Mar. 7, 2024

(51) Int. Cl.
*G11C 29/56* (2006.01)
*G06F 11/10* (2006.01)

(52) U.S. Cl.
CPC .... *G11C 29/56008* (2013.01); *G06F 11/1044* (2013.01)

(58) Field of Classification Search
CPC .............. G11C 29/56008; G06F 11/1044
USPC ..................................................... 714/718
See application file for complete search history.

(56) References Cited

U.S. PATENT DOCUMENTS

| | | | |
|---|---|---|---|
| 9,286,964 B2 * | 3/2016 | Halbert | G06F 3/0659 |
| 10,127,101 B2 | 11/2018 | Halbert et al. | |
| 2008/0082870 A1 | 4/2008 | Park | |
| 2011/0258515 A1 | 10/2011 | Earle et al. | |
| 2019/0050284 A1 * | 2/2019 | Brown | G06F 11/1044 |
| 2021/0208965 A1 * | 7/2021 | Cha | G11C 11/406 |
| 2023/0268022 A1 * | 8/2023 | Lu | G06F 21/577 |
| | | | 714/718 |

FOREIGN PATENT DOCUMENTS

| | | | | |
|---|---|---|---|---|
| CN | 111381999 A | * | 7/2020 | ......... G06F 11/1004 |
| CN | 112925688 | | 6/2021 | |
| CN | 113393890 | | 9/2021 | |
| CN | 107924705 | | 8/2022 | |
| TW | 202223903 | | 6/2022 | |
| WO | WO-2022066178 A1 | * | 3/2022 | |

OTHER PUBLICATIONS

"Office Action of Taiwan Counterpart Application", dated Aug. 30, 2023, p. 1-p. 4.
"Office Action of Taiwan Counterpart Application", issued on Jan. 30, 2024, p. 1-p. 6.

* cited by examiner

*Primary Examiner* — Guy J Lamarre
*Assistant Examiner* — Enam Ahmed
(74) *Attorney, Agent, or Firm* — JCIPRNET

(57) ABSTRACT

A memory device includes a data array, a parity array and an ECC circuit. The ECC circuit is coupled to the data array and the parity array. In a first test mode, the ECC function of the ECC circuit is disabled, and in a second test mode, the ECC circuit directly accesses the parity array to read or write parity information through the parity array.

16 Claims, 3 Drawing Sheets

TEST DEVICE AND TEST METHOD THEREOF

BACKGROUND OF THE INVENTION

Technical Field

The present invention generally relates to a test device and a test method thereof, and more particularly to the test method for testing an error correction and checking (ECC) counter of a memory device.

Description of Related Art

In conventional art, dynamic random access memory (DRAM) implements a new functions, such as error correction and checking (ECC) and error correction scrub (ECS). Verifying these new functions are a challenge for DRAM manufacturer and consumer.

In the DRAM, a ECC counter (error per row counter) increments a number of code words errors on a given row, after more than one error on a given row is detected.

The ECC counter is reset with each column address wrap. Each row's code word error count is compared to the previous code word error count to determine the row address with the highest error count within the DRAM. After reading all code words on a row, the number of errors counted is compared to the number of errors from the previous row. If the previous row error count is less than the present row error count, the present larger error count is saved to a Previous High Error Count register, its associated address is saved to the Previous High Error Count Row/Bank Address/Bank Group register, and the present row error counter is cleared. If the previous row error count is greater than the present row error count, the previous row error count and register value remains unchanged, however the present row error counter is cleared.

SUMMARY OF THE INVENTION

The present invention provides a test device and a test method thereof which is used for testing an error correction and checking (ECC) counter of a memory device.

The test device method includes: making a selected memory row of the memory device to be a victim row; performing a plurality of error correction scrub (ECS) operations on the memory device; reading a plurality of mode registers to obtain an address of a recorded victim row; and, comparing the address of the recorded victim row with an address of the selected memory row to generating a test result.

The test device includes a controller. The controller is configured to: making a selected memory row of the memory device to be a victim row; perform a plurality of error correction scrub (ECS) operations on the memory device; read a plurality of mode registers to obtain an address of a recorded victim row; and, compare the address of the recorded victim row with an address of the selected memory row to generating a test result In summary, the present disclosure provides the test device by making a selected memory row to be a victim row by a row hammer effect. The test device further performs a plurality of error correction scrub (ECS) operations on the memory device, and tests the ECC counter of the memory device by comparing an address of an recorded victim row with an address of the selected row.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
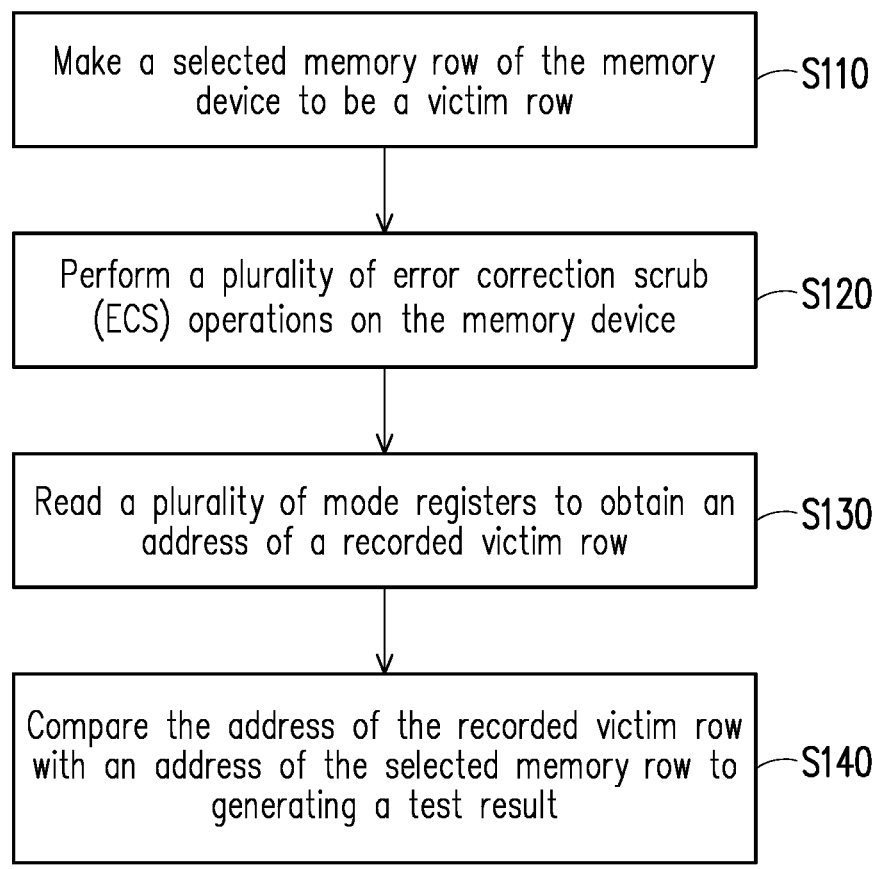
FIG. 1 illustrates a flow chart of a test method for testing an error correction and checking (ECC) counter of a memory device according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a flow chart of a test method for testing an error correction and checking (ECC) counter of a memory device according to an embodiment of present disclosure. The memory device may be a double data rate fifth-generation synchronous dynamic random-access memory (DDR5 SDRAM). The ECC count of the memory device is configured to increment a number of errors on a given row, and may be an error per row counter (EpRC). In step S110, one of a plurality of memory rows of the memory device can be selected to be a selected memory row, and the selected row of the memory device may be made to be a victim row. In this embodiment, the selected memory row can be made to be the victim row by a ping-pong row hammer effect. The ping-pong row hammer effect can be made by performing active pre-charge operations on a plurality of memory rows adjacent to the selected memory row a plurality of times. Number of the times for performing the active pre-charge operations can be determined by a designer of the memory device, and the designer may determine the number of the times for performing the active pre-charge operations according to an operation voltage, a working frequency, process parameters and layout information of the memory device, and no special limitation here.

In step S120, a plurality of error correction scrub (ECS) operations may be performed on the memory device. In this embodiment, the ECS operations may be performed through a manual ECS operation. In detail, the manual ECS operation of the memory device may be enabled firstly through a monitor register write command of the memory device. Then, one of the ECS operations can be performed by sending a multi-purpose command to the memory device, and a deselect operation may be performed by the memory device for meeting a ECS timing requirement. Furthermore, another one of the ECS operations can be further performed by sending the multi-purpose command to the memory device again. Such as that, the plurality of the ECS operations can be performed by repeatedly performing the steps mentioned above for N times, wherein N is a positive integer.

In detail, value of the times N may be determined by a density of the memory device. The N can be set by referring to a table 1 shown as below:

TABLE 1

| Density | 8 Gb | 16 Gb | 24 Gb | 32 Gb | 64 Gb |
|---------|------|-------|-------|-------|-------|
| N | $2^{26}$ | $2^{27}$ | $2^{27*1.5}$ | $2^{28}$ | $2^{29}$ |

Please be noted here, each of the ECS operations is performed by reading internal data and the writing back corrected data if an error occurred on the internal data. Thais, by performing the ECS operations several times, the ECC counter may count error number of each of each of the memory rows during the ECS operations.

In step S130, a plurality of mode registers may be read, and an address of a recorded victim row can be obtained. In this embodiment, an address of row hammer victim row may be recorded in a plurality of mode registers, such as the mode registers MR16, MR17 and MR18. Such as that, by reading the mode registers MR16, MR17 and MR18, the address of the recorded victim row with highest number of code word errors can be obtained.

In step S140, the address of the recorded victim row obtained through the mode registers MR16, MR17 and MR18 can be compared with an address of the selected memory row to generate a test result. The test result is configured to indicate whether the ECC counter of the memory device is pass or not. In detail, since the selected memory row is set to have highest number of code word errors, and the recorded victim row should be same as the selected row when a function of the ECC counter works normally. Such as that, in the step S140, if the address of the recorded victim row is same as the address of the selected row, the test result indicating the ECC counter passed can be generated; and if the address of the recorded victim row is different from the address of the selected row, the test result indicating the ECC counter failed can be generated.

Figure 2:
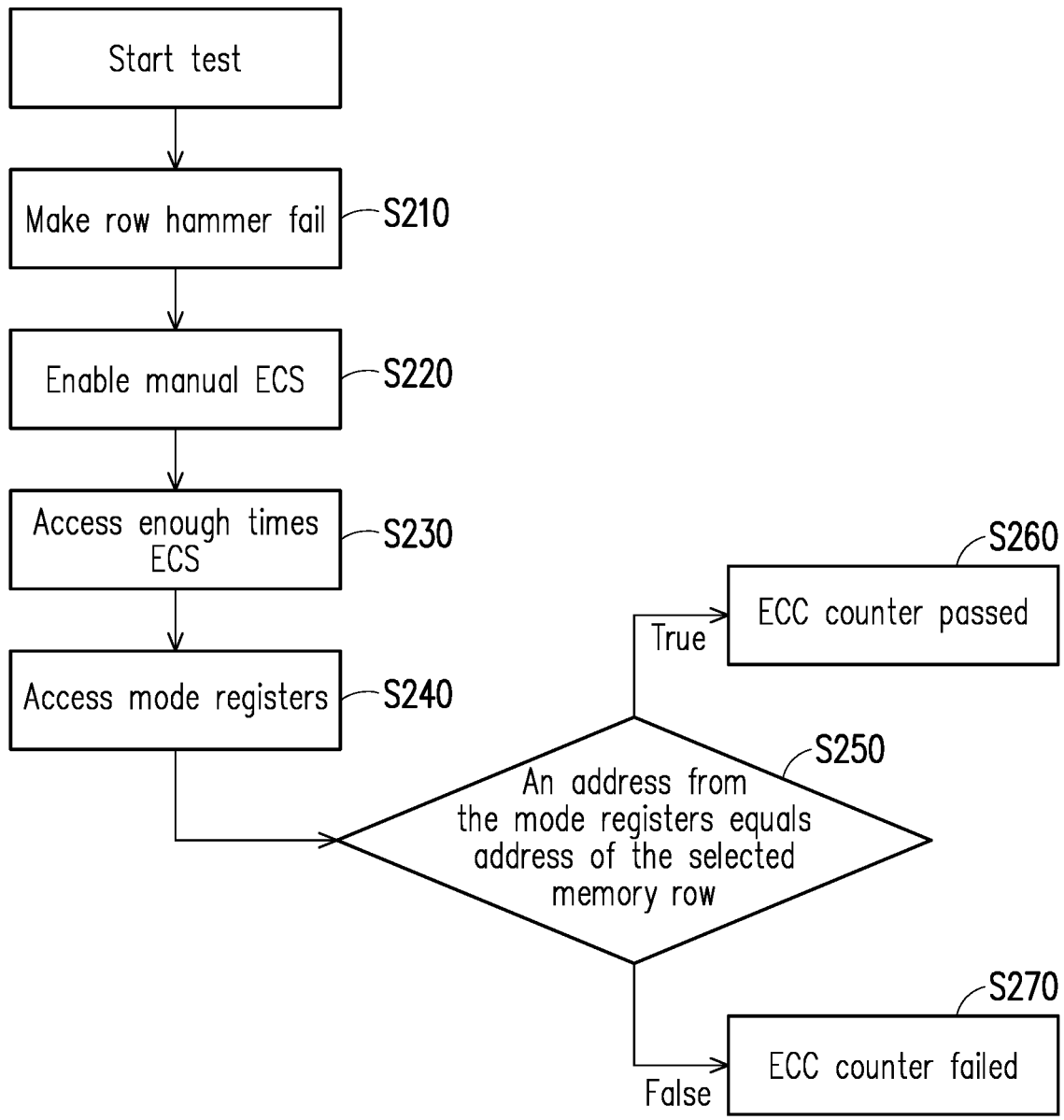
FIG. 2 illustrates a flow chart of a test method for testing an error correction and checking (ECC) counter of a memory device according to another embodiment of present disclosure.
Figure 3:
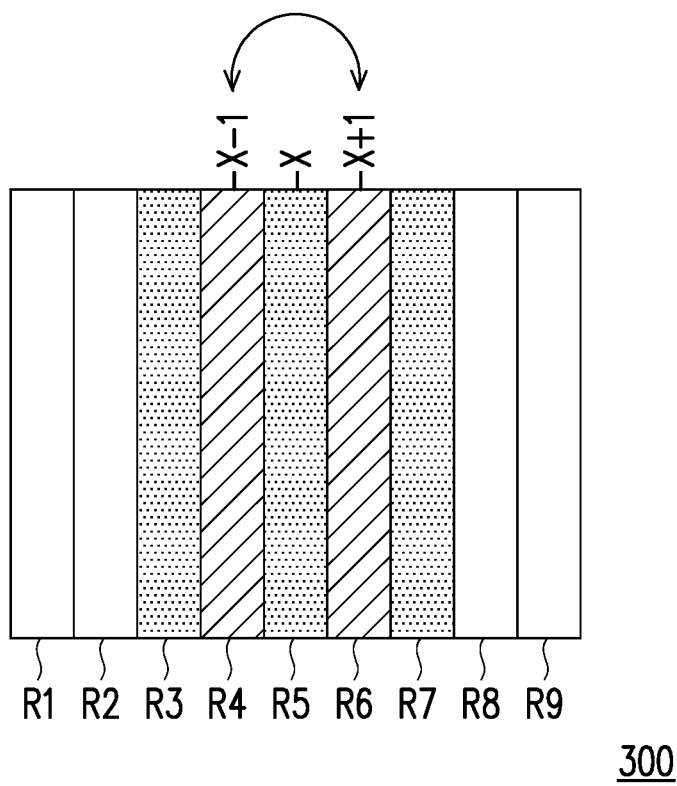
FIG. 3 illustrates a schematic diagram of a row hammer effect according to an embodiment of present disclosure.

Please refer to FIG. 2, which illustrates a flow chart of a test method for testing an error correction and checking (ECC) counter of a memory device according to another embodiment of present disclosure. In this embodiment, the memory device may be a double data rate fifth-generation synchronous dynamic random-access memory (DDR5 SDRAM). The ECC counter of the memory device is configured to increment a number of errors on a given row, and may be an error per row counter (EpRC). In step S210, a row hammer fail can be made on a selected memory row of the memory device. Please refer to FIG. 2 and FIG. 3 commonly, wherein FIG. 3 illustrates a schematic diagram of a row hammer effect according to an embodiment of present disclosure. In FIG. 3, a memory device 300 includes a plurality of memory rows R1 to R7. By performing an active pre-charge operation on one of the memory rows R1 to R7, row hammer effect may be performed on adjacent memory rows. Take the memory row R4 with an address X−1 as an example. If the active pre-charge operation is performed on the memory row R4, the row hammer effect may be performed on both of the memory row R3 and R5.

The row hammer fail of the step S210 may be performed by a ping-pong row hammer effect. In detail, take the memory row R5 with an address X as a selected memory row for example. A plurality of active pre-charge operations may be performed on the memory row R4 with the address X−1 and the memory row R6 with an address X+1 alternatively and continuously. Such as that, the memory row R5 will have maximum row hammer data error bits.

In detail, the step S210 can be performing according to a table 2:

TABLE 2

| Steps | Command | Address | Note |
|-------|---------|---------|------|
| 1 | Active | X − 1 | |
| 2 | Deselect | | Meet timing requirement |
| 3 | Pre-charge | | |
| 4 | Deselect | | Meet timing requirement |
| 5 | Active | X + 1 | |
| 6 | Deselect | | Meet timing requirement |
| 7 | Pre-charge | | |
| 8 | Deselect | | Meet timing requirement |
| 9 | Loop 1 to 8 with M times | | M must exceed ping-pong row hammer performance |

In the table 2, in the step 1, the memory row R4 with the address X−1 is active by an active command. In the step 2, a deselect command can be performed on the memory device 300 for meeting a requirement of the active command. In the step 3, a pre-charge command can be performed on the memory device 300, and the memory row R4 may be active pre-charged. In the step 4, the deselect command can be performed again on the memory device 300 for meeting a requirement of the pre-charge command. In the step 5 to the step 8, the memory row R5 with the address X+1 is selected to perform active pre-charge operation. In the step 9, the steps 1 to 8 can be looped with M times, and M must exceed ping-pong row hammer performance.

In step S220, a manual error correction scrub (ECS) operation can be enabled. Then, in step S230, a plurality of ECS operations with enough times can be accessed on the memory device. In this embodiment, the manual ECS operation may be enabled by sending a monitor register writing command (MPW14) with operation code 0x80 in hex-decimal to the memory device. Moreover, the ECS operations can be operated by following table 3:

TABLE 3

| Step | Command | Note |
|------|---------|------|
| 1 | MPC | OP code = 0xC |
| 2 | Deselect | Meet timing requirement |
| 3 | Loop 1-2 | Loop times is determined by density of the memory device |

In the table 3, in the step 1, a multi-purpose command (MPC) is sent to the memory device with operation (OP) code equal to 0xC in hex-decimal. One ECS operation can be performed on the memory device according to the multi-purpose command. In the step 2, a deselect command can be performed on the memory device for meeting a timing requirement of the ECS operation. In the step 3, the steps 1 to 2 can be looped with N times, and N may be determined by density of the memory device.

In step S240, a plurality of mode registers related to an address of a row hammer victim row are accessed. In this embodiment, the row hammer victim row is a recorded victim row recorded according a counting result of the ECC counter. In detail, mode registers MR16 to MR18 are mode registers of the memory device related to an address of the recorded victim row. The mode register M16 records bits 7 to 0 of a row address of the recorded victim row. The mode register M17 records bits 15 to 8 of the row address of the recorded victim row. The mode register M18 records bits 17 and 16 of the row address of the recorded victim row, a bank group address and a bank address of the recorded victim row.

In this embodiment, the mode registers MR16 to MR18 may be accessed by flowing table 4:

TABLE 4

| Step | Command | Note |
| --- | --- | --- |
| 1 | MRR16 | |
| 2 | Deselect | Meet timing requirement |
| 3 | MRR17 | |
| 4 | Deselect | Meet timing requirement |
| 5 | MRR17 | |
| 6 | Deselect | Meet timing requirement |

In the table 4, in the step 1, a mode register 16 read command MRR16 is performed on the memory device. In the step 2, a deselect command is performed on the memory device to meet a timing requirement of the MRR16. In the step 3, a mode register 17 read command MRR17 is performed on the memory device. In the step 4, the deselect command is performed on the memory device to meet a timing requirement of the MRR17. In the step 5, a mode register 18 read command MRR18 is performed on the memory device. In the step 6, the deselect command is performed on the memory device to meet a timing requirement of the MRR18.

In step S250, the address obtained from the mode registers MR16 to MR18 may be compared with an address of the selected memory row. If the address of the recorded victim row obtained from the mode registers MR16 to MR18 is same as the selected memory row, the ECC counter passed can be determined (in step S260); and if the address of the recorded victim row obtained from the mode registers MR16 to MR18 is different from the selected memory row, the ECC counter failed can be determined (in step S270).

Figure 4:
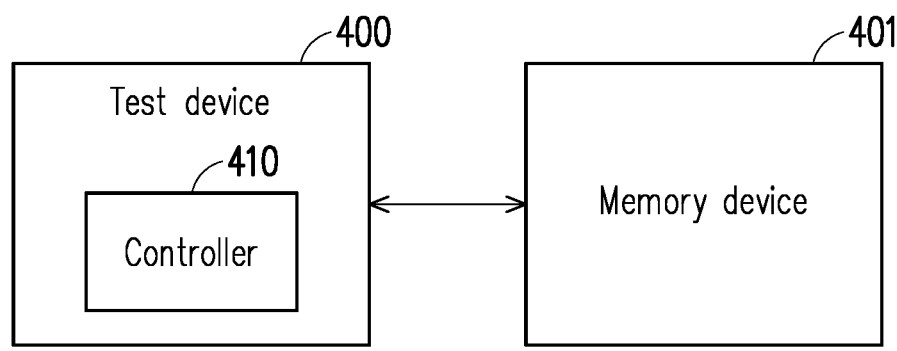
FIG. 4 illustrates a schematic diagram of a test device according to an embodiment of present disclosure.

Please refer to FIG. 4, which illustrates a schematic diagram of a test device according to an embodiment of present disclosure. The test device 400 is coupled to a memory device 401. The test device 410 includes a controller 411. The test device 410 may be a test equipment. The controller 411 may be a processor having a computation function. Alternatively, the controller 411 may be a hardware circuit designed by using hardware description language (HDL) or any digital circuit design method well known by related technicians of the field, and implemented through a field programmable gate array (FPGA), a complex programmable logic device (CPLD) or an application-specific integrated circuit (ASIC).

The memory device 401 may be a double data rate fifth-generation synchronous dynamic random-access memory (DDR5 SDRAM).

The controller 411 is configure to perform the steps S110 to S140 of FIG. 1, or perform the steps S210 to S270 of FIG. 2. Detail operations of the steps S110 to S140 and S210 to S270 have been described detailly in the embodiments mentioned above, and no more description here.

In some embodiment, the test device 400 may be embedded in the memory device 410 to perform a built-in self-test (BIST) function.

In summary, the test method of present disclosure provides a compare target by making a selected memory row to be a row hammer victim row. Furthermore, the test method of present disclosure set the ECC counter (error per row counter (EpRC)) of the memory device to operate by performing a plurality of error correction scrub (ECS) operations. That is, by comparing the address recorded in the mode registers related to the address of the row hammer victim row with the address of the selected memory row, the function of the ECC counter can be tested.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test method for testing an error correction and checking (ECC) counter of a memory device, comprising:
   selecting one of a plurality of memory rows of the memory device to be a selected memory row, and making the selected memory row of the memory device to be a victim row;
   performing a plurality of error correction scrub (ECS) operations on the memory device;
   reading a plurality of mode registers to obtain an address of a recorded victim row after the ECS operation is performed;
   comparing the address of the recorded victim row with an address of the selected memory row to generate a test result; and
   determining a function of the ECC counter works normally in response to the test result indicating that the address of the recorded victim row obtained from the plurality of mode register matches the address of the selected memory row.

2. The test method according to claim 1, wherein a step of making the selected memory row of the memory device to be the victim row comprises:
   making the selected memory row of the memory device to be the victim row by a ping-pong row hammer effect.

3. The test method according to claim 2, wherein a step of making the selected memory row of the memory device to be the victim row by the ping-pong row hammer effect comprises:
   continuously performing a plurality of active pre-charge operations on a plurality of memory rows adjacent to the selected memory row.

4. The test method according to claim 1, wherein a step of performing the plurality of ECS operations on the memory device comprises:
   (a) enabling a manual ECS operation;
   (b) performing each of the plurality of ECS operations;
   (c) performing a deselect operation to meet a ECS timing requirement; and
   (d) performing the steps (b) and (c) for N times, wherein N is a positive integer.

5. The test method according to claim 4, wherein the N is determined by a density of the memory device.

6. The test method according to claim 1, wherein a step of reading the plurality of mode registers to obtain the address of the recorded victim row comprises:
   (a) performing a first reading operation to read a first mode register;
   (b) performing a deselect operation to meet a mode register reading timing requirement;

(c) performing a second reading operation to read a second mode register;
(d) performing the deselect operation to meet the mode register reading timing requirement;
(e) performing a third reading operation to read a third mode register; and
(f) performing the deselect operation to meet the mode register reading timing requirement.

7. The test method according to claim 6, wherein the first register, the second register and the third register record a row address of the recorded victim row, the third register records a bank group address and a bank address of the recorded victim row.

8. The test method according to claim 1, wherein a step of comparing the address of the recorded victim row with the address of the selected memory row to generating the test result comprises:
generating the test result for indicating the ECC counter is passed if the address of the recorded victim row is same as the address of the selected memory row; and
generating the test result for indicating the ECC counter is failed if the address of the recorded victim row is different from as the address of the selected memory row.

9. A test device, coupled to a memory device for testing an error correction and checking (ECC) counter, comprising:
a controller, being configured to:
select one of a plurality of memory rows of the memory device to be a selected memory row, and make the selected memory row of the memory device to be a victim row;
perform a plurality of error correction scrub (ECS) operations on the memory device;
read a plurality of mode registers to obtain an address of a recorded victim row after the ECS is performed;
compare the address of the recorded victim row with an address of the selected memory row to generate a test result; and
determine a function of the ECC counter works normally in response to the test result indicating that the address of the recorded victim row obtained from the plurality of mode register matches the address of the selected memory row.

10. The test device according to claim 9, wherein the controller is further configured to:
make the selected memory row of the memory device to be the victim row by a ping-pong row hammer effect.

11. The test device according to claim 10, wherein the controller is further configured to:
continuously perform a plurality of active pre-charge operations on a plurality of memory rows adjacent to the selected memory row to perform the ping-pong row hammer effect.

12. The test device according to claim 9, wherein the controller is further configured to:
(a) enable a manual ECS operation;
(b) perform each of the plurality of ECS operations;
(c) perform a deselect operation to meet a ECS timing requirement; and
(d) perform the steps (b) and (c) for N times, wherein N is a positive integer.

13. The test device according to claim 12, wherein the N is determined by a density of the memory device.

14. The test device according to claim 9, wherein the controller is further configured to:
(a) perform a first reading operation to read a first mode register;
(b) perform a deselect operation to meet a mode register reading timing requirement;
(c) perform a second reading operation to read a second mode register;
(d) perform the deselect operation to meet the mode register reading timing requirement;
(e) perform a third reading operation to read a third mode register; and
(f) perform the deselect operation to meet the mode register reading timing requirement.

15. The test device according to claim 14, wherein the first register, the second register and the third register record a row address of the recorded victim row, the third register records a bank group address and a bank address of the recorded victim row.

16. The test device according to claim 9, wherein the controller is further configured to:
generate the test result for indicating the ECC counter is passed if the address of the recorded victim row is same as the address of the selected memory row; and
generate the test result for indicating the ECC counter is failed if the address of the recorded victim row is different from as the address of the selected memory row.

* * * * *